US008881885B2

(12) United States Patent
Nakamura et al.

(10) Patent No.: US 8,881,885 B2
(45) Date of Patent: *Nov. 11, 2014

(54) RAW MATERIAL LOADING APPARATUS (75) Inventors: Takaya Nakamura, Toyohashi (JP);
Takashi Yada, Toyohashi (JP);
Hidetaka Miyata, Minato-ku (JP);
Noriyuki Haneda, Toyohashi (JP);
Shigeru Oikawa, Toyohashi (JP); Akira Kouketsu, Toyohashi (JP); Katsuhiko Nakano, Toyohashi (JP); Mitsuo Kawai, Toyohashi (JP); Yoshifumi Ochi, Toyohashi (JP)

(73) Assignee: Sinfonia Technology Co., Ltd., Tokyo (JP)

(*) Notice: Subject to any disclaimer, the term of this patent is extended or adjusted under 35 U.S.C. 154(b) by 100 days.

This patent is subject to a terminal disclaimer.

(21) Appl. No.: 13/430,287

(22) Filed: Mar. 26, 2012

(65) Prior Publication Data
US 2012/0199221 A1 Aug. 9, 2012

Related U.S. Application Data (63) Continuation of application No. PCT/JP2011/067774, filed on Aug. 3, 2011.

(30) Foreign Application Priority Data

Aug. 9, 2010 (JP) ................................ 2010-178954
Aug. 9, 2010 (JP) ................................ 2010-178955

(51) Int. Cl.
*B65G 11/00* (2006.01)
*C30B 15/00* (2006.01)
*C30B 29/06* (2006.01)

(52) U.S. Cl.
CPC .............. *C30B 15/002* (2013.01); *C30B 29/06* (2013.01)
USPC ............................... 193/15; 193/30; 193/2 R (58) Field of Classification Search
USPC ............................... 193/2 R, 3, 15, 16, 28, 30
See application file for complete search history.

(56) References Cited

U.S. PATENT DOCUMENTS 1,918,029 A * 7/1933 Goetz ........................... 414/163
2,037,554 A * 4/1936 Wagstaff ....................... 414/208
(Continued)

FOREIGN PATENT DOCUMENTS

JP 58-55539 4/1983
JP 59-115736 7/1984
(Continued)

OTHER PUBLICATIONS

Japanese Search Report with English translation mailed on Nov. 8, 2011 in PCT/JP2011/067774, filed on Aug. 3, 2011.
(Continued)

*Primary Examiner* — Leslie A Nicholson, III
*Assistant Examiner* — Keith R Campbell
(74) *Attorney, Agent, or Firm* — Oblon, Spivak, McClelland, Maier & Neustadt, L.L.P.

(57) ABSTRACT

An apparatus includes a processing apparatus that processes raw material in an airtight state, an accommodation section that accommodates the raw material, a first feeding path that is provided outside the processing apparatus and receives the raw material from the accommodation section, and a second feeding path having upstream and downstream ends that are outside and inside the processing apparatus, respectively. The second feeding path receives the raw material from the first feeding path. The apparatus also includes a joint section that separates and joins the first path and the second path, and a closing section that is positioned in the second path closer to the processing apparatus than the joint section and maintains the processing apparatus, and the second path in an airtight state when the joint section separates the first path and the second path.

10 Claims, 6 Drawing Sheets

(56) References Cited

U.S. PATENT DOCUMENTS

| | | | | |
|---|---|---|---|---|
| 2,726,682 | A | * | 12/1955 | Conroy et al. .............. 285/236 |
| 3,628,676 | A | * | 12/1971 | Tucker ..................... 414/199 |
| 3,780,887 | A | * | 12/1973 | Bottoms .................... 414/299 |
| 3,924,666 | A | * | 12/1975 | Raison ..................... 141/231 |
| 4,029,220 | A | * | 6/1977 | Greaves .................... 414/206 |
| 4,176,994 | A | * | 12/1979 | Sangster ................... 414/163 |
| 4,245,824 | A | * | 1/1981 | Rymarchyk ................. 266/287 |
| 5,154,271 | A | * | 10/1992 | Binzen ....................... 193/30 |
| 5,384,015 | A | * | 1/1995 | Schroter et al. ............. 202/251 |
| 5,882,484 | A | * | 3/1999 | Pyy .......................... 202/262 |
| 6,152,668 | A | * | 11/2000 | Knoch ...................... 414/164 |
| 7,690,494 | B2 | * | 4/2010 | Rillmann .................... 193/30 |
| 8,387,770 | B2 | * | 3/2013 | Knoch ....................... 193/30 |
| 8,684,151 | B2 | * | 4/2014 | Tadokoro et al. ............. 193/30 |

FOREIGN PATENT DOCUMENTS

| | | | |
|---|---|---|---|
| JP | 59115736 A | * 7/1984 | ............. B01J 4/00 |
| JP | 62-11169 | 1/1987 | |
| JP | 62-181894 | 11/1987 | |
| JP | 63-194296 U | 12/1988 | |
| JP | 7-12897 | 3/1995 | |
| JP | 7-133987 A | 5/1995 | |
| JP | 2003-021470 | 1/2003 | |
| JP | 2010-22920 | 2/2010 | |

OTHER PUBLICATIONS

International Preliminary Report on Patentability issued Feb. 21, 2013 in PCT/JP2011/067774 filed Aug. 3, 2011.

International Preliminary Report on Patentability issued Mar. 21, 2013 in PCT/JP2011/067774 filed Aug. 3, 2011.

Written Opinion issued Nov. 8, 2011 in PCT/JP2011/067774 filed Aug. 3, 2011 (with English-language translation).

U.S. Appl. No. 13/420,297, filed Mar. 14, 2012, Tadokoro, et al.

* cited by examiner

RAW MATERIAL LOADING APPARATUS

CROSS-REFERENCE TO RELATED APPLICATION

This application is a continuation application of International Application No. PCT/JP2011/067774, filed Aug. 3, 2011, the entire contents of which are incorporated herein by reference. PCT/JP2011/067774 claims priority to JP 2010-178954, filed Aug. 9, 2010 and JP 2010-178955 filed Aug. 9, 2010.

TECHNICAL FIELD

The present invention relates to a processed object loading apparatus for loading a processed object in an airtight state from the outside to the inside of a processing apparatus which processes a processed object in an airtight state.

Further, the present invention relates to a processed object loading apparatus for loading a processed object from the outside to the inside of a processing apparatus which melts a processed object by means of a furnace body provided in the inside thereof.

BACKGROUND ART

A processing apparatus which processes a processed object in an airtight state is known. For example, an apparatus is known which carries out a process for loading and melting a silicon material which is a processed object into and in a processing apparatus and solidifying the melted silicon material to fabricate single crystal silicon which is a material for a semiconductor substrate. In the fabrication process of single crystal silicon, the inside of the processing apparatus is placed in a special atmosphere different from that in the open air. For example, the inside of the processing apparatus is placed in an inactive gas atmosphere or a vacuum atmosphere.

Then, also a processed object loading apparatus for loading a processed object from the outside into the inside of the processing apparatus is known (for example, Patent Documents 1 and 2).

The processed object loading apparatus (silicon granulation supplying apparatus) disclosed in Patent Document 1 includes a hopper, a feeder, a housing, a quartz port and a bellows. The hopper is provided for accommodating silicon granulation into the inside of the housing having an inactive gas atmosphere, and the feeder for feeding a processed object (silicon granulation) is provided below the hopper. The quartz port is connected to the housing through the bellows. The quartz port is partly inserted in the inside of a processing apparatus (heating furnace) and communicated with the inside of the heating furnace. The inside of the silicon granulation supplying apparatus and the heating furnace is placed in an airtight state. In particular, the inside is placed in an inactive gas atmosphere. More particularly, the inside of the silicon granulation supplying apparatus and the heating furnace is placed in the same inactive gas atmosphere. Consequently, silicon granulation can be loaded from the hopper into the inside of the heating through the quartz port in an airtight state (inactive gas atmosphere).

Further, in the processed object loading apparatus (silicon granulation supplying apparatus), a lower end portion of the quartz port which is a path for guiding silicon granulation to a pot in the inside of the processing apparatus is fixed to a peripheral portion of the pot so as not to interfere with single crystal silicon drawn up from the pot.

Also a processed object loading apparatus (mold charge supplying apparatus) disclosed in Patent Document 2 has a basic configuration similar to that of the apparatus disclosed in Patent Document 1. The processed object loading apparatus (mold charge supplying apparatus) includes a hopper, a trough, a vibration section, a mold charge loading chamber and a shooter. The mold charge loading chamber is placed in a vacuum atmosphere and the hopper for accommodating a processed object (mold charge) is provided in the inside of the mold charge loading chamber. The trough for feeding a mold charge and the vibration section are provided below the hopper. The shooter is partly inserted in the inside of a processing apparatus (vacuum chamber) and is communicated with the inside of the vacuum chamber. The mold charge loading chamber and the vacuum chamber are configured so as to be sealed from the outside air, and the inside of the chambers is placed in an airtight state. In particular, the inside of the chambers is placed in a vacuum atmosphere. More particularly, the inside of the mold charge supplying apparatus and the vacuum chamber is placed in the same vacuum atmosphere. Consequently, a mold charge can be loaded from the hopper to the inside of the vacuum chamber through the shooter in an airtight state (vacuum atmosphere).

PRIOR ART DOCUMENTS

Patent Documents

Patent Document 1: Japanese Patent Laid-Open No. Sho 59-115736
Patent Document 2: Japanese Patent Laid-Open No. 2003-21470

DISCLOSURE OF INVENTION

Technical Problem

Incidentally, in the processed object loading apparatus (silicon granulation supplying apparatus) disclosed in Patent Document 1, if silicon granulation must be supplemented into the hopper because of consumption of silicon granulation accommodated in the hopper, then a lid provided on the housing is opened and silicon granulation is supplemented into the hopper. Further, in the processed object loading apparatus (mold charge supplying apparatus) disclosed in Patent Document 2, when it becomes necessary to supplement a mold charge into the hopper because of consumption of a mold charge accommodated in the hopper, a vacuum door provided for the mold charge loading chamber is opened and a mold charge is supplemented into the hopper through the opening.

However, both of the processed object loading apparatus (silicon granulation supplying apparatus and mold charge supplying apparatus) are communicated with the inside of a processing apparatus. Therefore, if it is tried to supplement a processed object during processing by the processing apparatus, then also the inside of the processing apparatus is opened to the outside air in accordance with opening of the processed object loading apparatus (opening of a lid or a vacuum door). As a result, an airtight state (special atmosphere) maintained till then is broken. Consequently, supplementation of the processed object cannot be carried out during processing and need be carried out after the processing. Therefore, there is a problem that idle time (operation stopping time) increases.

Further, in the processed object loading apparatus (silicon granulation supplying apparatus) disclosed in Patent Document 1, the lower end portion of the quartz port is fixed to the peripheral portion of the pot. Therefore, the silicon granulation is loaded to the peripheral portion of the pot as described above, and the loaded silicon granulation is accumulated in a one-sided state on the peripheral portion of the pot until the silicon granulation is melted. Since the pot is structured such that it is heated at the peripheral portion thereof, if the silicon granulation is placed in a state in which it is one-sided on the peripheral portion of the pot, then the silicon granulation is heated not uniformly and cannot be melted efficiently. Therefore, a drawing-up operation of single crystal silicon cannot be carried out smoothly and the fabrication efficiency is low.

Therefore, the present invention has been made in view of such a problem which the conventional processed object loading apparatus has, and it is a subject of the present invention to provide a processed object loading apparatus capable of supplementing a processed object into a processed object loading apparatus without destroying a special atmosphere in the inside of a processing apparatus.

Further, it is a subject of the present invention to provide a processed object loading apparatus capable of efficiently melting a processed object to enhance the fabrication efficiency.

Technical Solution

According to the present invention, there is provided a processed object loading apparatus for loading a processed object in an airtight state from the outside into the inside of a processing apparatus which processes the processed object in an airtight state, including a processed object accommodation section capable of temporarily accommodating a processed object and having an accommodation port which is used when a processed object is accommodated into the processed object accommodation section and can be opened and closed, and a feeding section including a processed object path through which a processed object to be loaded into the inside of the processing apparatus can pass in an airtight state and a processed object extraction mechanism capable of extracting the processed object in an airtight state from the processed object accommodation section to the processed object path, the feeding section including a closing section capable of blocking the processing apparatus side and the processed object accommodation section side of the feeding section, and a joint section capable of separating and joining the feeding section at a position of the feeding section on the processed object accommodation section side with respect to the closing section.

With the configuration described above, by closing up the closing section, it is possible to block the processing apparatus side and the processed object accommodation section side of the feeding section to maintain a special atmosphere in the inside of the processing apparatus. Further, the processing apparatus side and the processed object accommodation section side of the feeding section can be separated from each other by the joint section.

Therefore, the processing apparatus side can continue processing of the processed object. Meanwhile, on the processed object accommodation section side, a processed object can be accommodated (supplemented) into the processed object accommodation section from the open accommodation port at a suitable convenient place such as, for example, the place or some other place.

Preferably, the processed object loading apparatus further includes a moving mechanism capable of moving a portion of the feeding section on the processed object accommodation section side with respect to the joint section in directions in which the portion moves toward and away from the processing apparatus.

With the configuration described above, it is possible to move the portion of the feeding section on the processed object accommodation section side with respect to the joint section to an arbitrary position with respect to the processing apparatus and carry out accommodation (supplementing) of the processed object into the processed object accommodation section.

Preferably, the processed object loading apparatus is configured such that the moving mechanism can carry out, regarding movement in the directions in which the portion moves toward and away from the processing apparatus, movement in upward and downward directions and movement in different directions other than the upward and downward directions, the separation and joining of the joint section being carried out in response to the movement in the upward and downward directions of the moving mechanism, the moving mechanism including a positioning section for restricting the movement in the different directions at a position at which the separation and joining of the joint section is carried out.

With the configuration described above, the movement, by the moving mechanism, of the portion of the feeding section on the processed object accommodation section side with respect to the joint section can be carried out such that, while the movement in the other directions is restricted, the movement in the upward and downward directions which are directions in which the joint section is separated and joined is permitted. Accordingly, separation and joining of the joint section can be carried out accurately and rapidly.

Preferably, the processed object loading apparatus is configured such that at least one of two portions of the joint section which are separated from each other upon the separation includes a guiding section and the other one of the two portions includes a guided section, and the joint section is placed into a joined state by guidance of the guided section by the guiding section.

With the configuration described above, the joint section can be introduced into a joined state accurately and rapidly.

Further, according to the present invention, there is provided a processed object loading apparatus which loads a processed object from the outside into the inside of a processing apparatus which melts the processed object by a furnace body provided in the inside thereof, including a processed object path along which a processed object to be loaded into the inside of the processing apparatus can pass, a downstream end of the processed object path with reference to the passing direction of the processed object being movable between a position in a central region including a vertical line which passes the center of the furnace body and another position displaced from the central region.

With the configuration described above, upon loading of a processed object, the processed object can be loaded at a position in the central region proximate to the center of the furnace body. On the other hand, upon drawing up of single crystal silicon, the downstream end of the processed object path can be retracted to a position displaced from the central region so that it does not interfere with the drawn up single crystal silicon.

Preferably, the processed object loading apparatus is configured such that at least a portion of the processed object path including a downstream end is a linear pipe, the pipe being movable in a longitudinal direction thereof so as to allow movement of a downstream end thereof between a position in the central region and another position displaced from the central region, the downstream end of the pipe being cut open along a plane parallel to the vertical line which passes the center of the furnace body.

With the configuration described above, the distance of movement of the pipe between the position in the central region and the position displaced from the central region can be minimized.

Preferably, the processed object loading apparatus which loads a processed object in an airtight state from the outside into the inside of the processing apparatus which melts the processed object in an airtight state by means of the furnace body, further includes a processed object accommodation section capable of temporarily accommodating a processed object and having an accommodation port which is used when a processed object is accommodated into the processed object accommodation section and can be opened and closed, and a feeding section including the processed object path configured from a first processed object path and a second processed object path, and a processed object extraction mechanism capable of extracting the processed object in an airtight state from the processed object accommodation section to the processed object path, the feeding section including a closing section for blocking the processing apparatus side and the processed object accommodation section side of the feeding section, and a joint section capable of separating and joining the first processed object path and the second processed object path at a position of the feeding section on the processed object accommodation section side with respect to the closing section, the second processed object path being configured for movement with respect to the processing apparatus in a state in which the first processed object path is separated by the joint section.

With the configuration described above, the space necessary for the movement can be reduced, and the apparatus can be miniaturized.

Advantageous Effects

According to the present invention, supplementing of a processed object can be carried out without breaking a special atmosphere in the inside of the processing apparatus, and consequently, idle time (operation stopping time) can be reduced to enhance the productivity.

Further, according to the present invention, the fabrication efficiency can be improved by melting the processed object efficiently.

BRIEF DESCRIPTION OF DRAWINGS

(A) of FIG. 3 is a schematic view illustrating a state in which a joint section is separated, and (B) of FIG. 3 is a schematic view illustrating a state in which a loading apparatus main body is moved downwardly.

(A) of FIG. 6 is a vertical sectional view illustrating a case in which a processed object path is positioned rather near to the inner side of the processing apparatus, (B) of FIG. 6 is a schematic view showing a moving mechanism for the processed object path as viewed in a direction indicated by an arrow mark X in (A) of FIG. 6, (C) of FIG. 6 is a vertical sectional view illustrating a case in which the processed object path is positioned rather near to the outer side of the processing apparatus, and (D) of FIG. 6 is a schematic view showing the moving mechanism for the processed object path as viewed in a direction indicated by an arrow mark Y in (C) of FIG. 6.

MODE FOR CARRYING OUT THE INVENTION

The present invention is described below in connection with an embodiment thereof with reference to the drawings. In regard to terms used to represent directions in the following description, "upward and downward" directions are represented with reference to upward and downward directions in FIG. 1. Meanwhile, in regard to "forward and backward" directions, the side near to a processing apparatus F1 is represented as a forward direction and the side remote from the processing apparatus F1 is represented as a backward direction. Further, "upstream and downstream" are given with reference to the passing direction (flowing direction) of a processed object S. However, it shall not be understood that the present invention is restricted to the mode described in connection with the above-described directions.

—Processing Apparatus—

Figure 1:
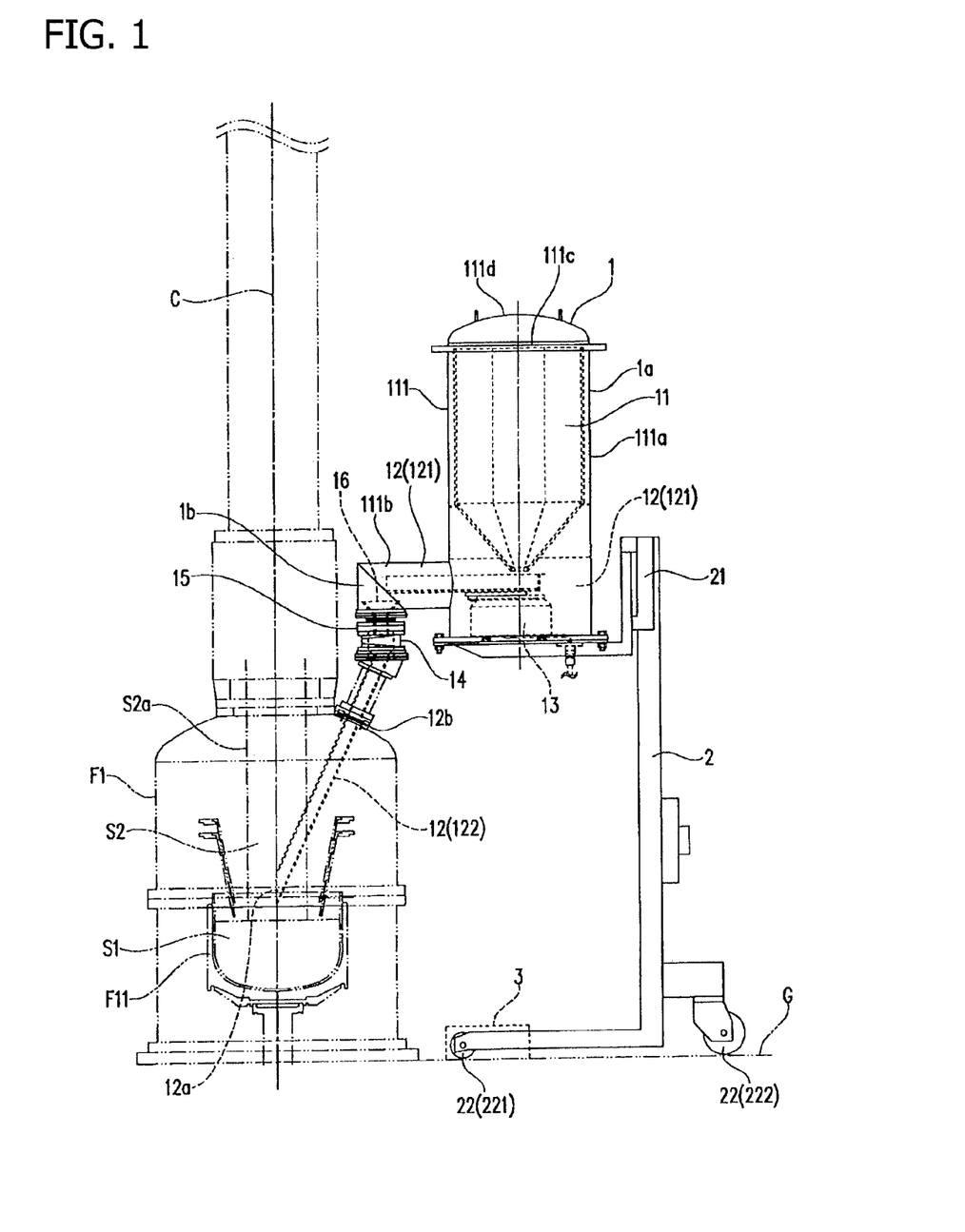
FIG. 1 is a schematic view showing a processing apparatus and a processed object loading apparatus.

First, a processing apparatus F1 which is an object to which a processed object loading apparatus 1 according to the present embodiment is to be attached is described. As shown in FIG. 1, in the processing apparatus F1, the inside thereof can be placed in an airtight state and a processed object S can be melted by means of an furnace body (pot) F11 provided in the inside of the processing apparatus F1. In the present embodiment, the processing apparatus F1 is used for fabricating single crystal silicon S2 which is a material for a semiconductor substrate. In the furnace body F11, polycrystalline silicon in the form of nuggets (silicon nuggets) is loaded as the processed object S and is melted by heating. Incidentally, the diametrical dimension of the silicon nuggets used in the present embodiment is approximately 10 mm. It is to be noted that the processing apparatus F1 may be of the type wherein the inside thereof is not placed in an airtight state depending upon the type of or the processing contents for the processed object S.

In the processing apparatus F1 of the present embodiment, the single crystal silicon S2 is fabricated by the CZ method. The fabrication method for the single crystal silicon S2 in the present embodiment is described briefly. First, in an inactive gas atmosphere, the silicon nuggets loaded in the furnace body F11 are heated to approximately 1,800° C. so as to be melted. Single crystal silicon used as a seed is soaked into the silicon (hereinafter referred to as "molten material") S1 placed in a melted state, and thereafter, the single crystal silicon used as a seed is drawn up slowly while it is rotated so that crystal is grown. Then, the single crystal silicon (ingot) S2 which is a substantially cylinder-shaped solid body is formed finally. In other words, the processing apparatus F1 is used to draw up the single crystal silicon S2 from the molten material S1.

In particular, the inactive gas atmosphere in the present embodiment signifies an atmosphere configured by placing the internal space of the processing apparatus F1 into a vacuum state once and thereafter filling the internal space with inactive gas such as argon, nitrogen or the like. Therefore, an exhausting pump (vacuum pump) and an inactive gas supplying pipe (not shown) are provided in the processing apparatus F1. It is to be noted that, if a closing section 14 hereinafter described is not closed, then also the inside of the processed object loading apparatus 1 hereinafter described is placed in the inactive gas atmosphere same as that in the processing apparatus F1.

Here, the inside of the processing apparatus F1 may be placed in a vacuum atmosphere depending upon the kind of the processed object S. Particularly, where it is desired to remove impurity from the molten material S1, there is the possibility that the inside of the processing apparatus F1 may be placed in a vacuum atmosphere. However, where the inside of the processing apparatus F1 is placed in a vacuum atmosphere in this manner, part of the processed object S is evaporated in the inside of the processing apparatus F1. Since the evaporation just described is inconvenient in the present embodiment, the inactive gas is introduced into the inside of the processing apparatus F1 in order to suppress evaporation of the silicon by pressure of the inactive gas. It is to be noted that the pressure of the inactive gas introduced in the inside of the processing apparatus F1 is optimized for the kind of the processed object S.

Further, while the material which configures the processed object S in the present embodiment is silicon, the processed object S which is a target of the present invention is not limited to this. Various materials such as metal and resin can be used as the processed object S other than silicon.

Further, while the "process" in the present embodiment includes a series of operations from melting by heating of silicon nuggets to formation of single crystal silicon (ingot) by drawing up from the molten material S1, the "process" in the present invention is wider in concept and signifies general operation for applying various physical variations or chemical variations to the processed object S in an airtight state.

—Processed Object Loading Apparatus—

Figure 2:
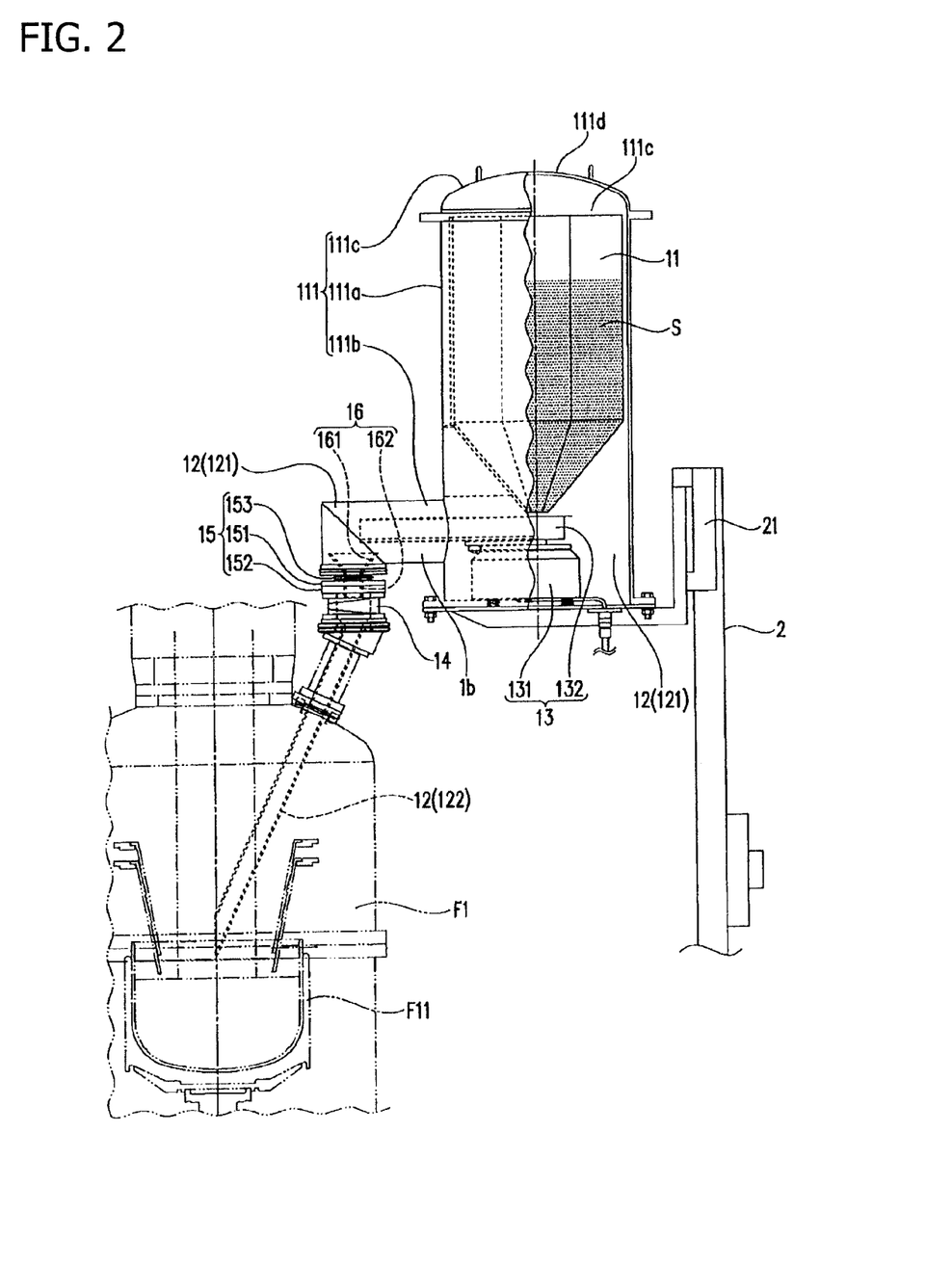
FIG. 2 is a schematic view showing the processed object loading apparatus with essential part of the apparatus enlarged.

As shown in FIGS. 1 and 2, the processed object loading apparatus 1 can load the processed object S from the outside of the processing apparatus F1 into the furnace body F11 in the inside of the processing apparatus F1 described above. It is to be noted that, in the following description, associated elements which are to be separated at a joint section 15 hereinafter described and are placed on a processed object accommodation section 11 side with respect to the joint section 15 are generally referred to as a loading apparatus main body 1a. It is to be noted that, while the processed object loading apparatus 1 in the present embodiment is configured such that the inside thereof can be placed in an airtight state, similarly to the processing apparatus F1, the inside of the processed object loading apparatus 1 may not be placed in an airtight state depending upon the type of or the processing contents for the processed object S.

The processed object loading apparatus 1 includes the processed object accommodation section 11 and a feeding section 1b. The feeding section 1b is a section which feeds the processed object S accommodated in the processed object accommodation section 11 to the processing apparatus F1, and includes a processed object path 12 and a processed object extraction mechanism 13. Further, the feeding section 1b includes the closing portion 14 and the joint section 15. Details of the components are hereinafter described.

The processed object S passes the processed object path 12 in the feeding section 1b from the processed object accommodation section 11 and is fed to the processing apparatus F1. A portion of the feeding path with which the processed object S contacts is configured from quartz glass which is a material having resistance against abrasion, or the inner face of the portion is configured from quartz glass. Consequently, the possibility that impurity such as metal powder produced by abrasion or the like may be mixed into the processed object S can be suppressed as far as possible, and single crystal silicon S2 having high purity can be fabricated.

In the present embodiment, the processed object accommodation section 11, part of the processed object path 12 and the processed object extraction mechanism 13 are provided in the inside of a supplying tank 111 made of stainless alloy. Where the processed object loading apparatus 1 is attached to the processing apparatus F1, the supplying tank 111 itself can maintain an airtight state against the outside air. It is to be noted that the "outside air" in the description of the present embodiment signifies an outside atmosphere of the processed object loading apparatus 1 and the processing apparatus F1.

The supplying tank 111 includes a supplying tank main body 111a having a substantially cylindrical shape and a projection 111b projecting in a horizontal direction from the supplying tank main body 111a, and the two are integrated with each other. It is to be noted that such a structure may be adopted that the supplying tank 111 is not provided and the processed object accommodation section 11 and the processed object path 12 are directly connected to each other such that an airtight state against the outside air can be maintained.

—Processed Object Accommodation Section (Hopper)—

The processed object accommodation section 11 is a section which can temporarily accommodate the processed object S until the processed object S is fed, and includes an accommodation port 111c which can be opened and closed. The accommodation port 111c is used when the processed object S is accommodated into the processed object accommodation section 11. In the present embodiment, the accommodation port 111c can be opened and closed by a lid section 111d. Further, in the present embodiment, a hopper is used as the processed object accommodation section 11. The hopper 11 is provided by pasting flat plates of quartz glass in the supplying tank 111 described above. The hopper 11 is shaped such that an octagonal cone is connected to a lower end of an octagonal pillar whose upper and lower end portions are open. In the hopper 11, the lower end of the octagonal cone portion is open, and the processed object S drops from the octagonal cone portion under gravity and is extracted to the feeding section 1b.

If the shape of the hopper 11 is adopted in which an octagonal pillar and an octagonal cone are combined with each other as in the present embodiment, then flat plates of quartz glass having a rectangular shape or a trapezoidal shape as viewed in plan can be combined to form the hopper 11. Therefore, the hopper 11 can be fabricated readily and the fabrication cost for the hopper 11 can be suppressed. It is to be noted that the shape of the processed object accommodation section 11 is not limited to such a shape that an octagonal pillar and an octagonal cone are combined with each other as in the hopper of the present embodiment, and a shape wherein a different multilateral pillar and a different multilateral cone are combined with each other may be adopted. Further, a cylindrical shape may be adopted for the processed object accommodation section 11 of the present invention as occasion demands.

The lid section 111d in the present embodiment is provided at an upper end portion of the supplying tank main body 111a such that an airtight state against the outside air can be maintained. By removing the lid section 111d from the supplying tank main body 111a, the accommodation port 111c can be opened so that the processed object S can be supplemented into the hopper 11.

—Processed Object Path—

The processed object path 12 is a portion through which the processed object S to be loaded into the processing apparatus F1 can pass. An upper end of the processed object path 12 is provided at a position at which the processed object S can be received from the hopper 11. Then, a downstream end 12a of the processed object path 12 is provided at a position at which the processed object S can be loaded into the inside of the processing apparatus F1. More particularly, the downstream end 12a of the processed object path 12 is positioned in the inside of the processing apparatus F1 and above the furnace body F11.

The processed object path 12 in the present embodiment includes a first processed object path 121 positioned on the hopper 11 side and a second processed object path 122 positioned on the processing apparatus F1 side. The first processed object path 121 and the second processed object path 122 can be separated from and joined to each other at the joint section 15 hereinafter described. The downstream end 12a of the processed object path 12 belongs to the second processed object path 122. In the present embodiment, the second processed object path 122 is not separated from the processing apparatus F1. Therefore, only it is necessary for a moving mechanism 2 hereinafter described to be capable of moving the first processed object path 121, but the moving mechanism 2 need not take a burden of movement of the second processed object path 122. In particular, since the processed object path 12 includes the first processed object path 121 and the second processed object path 122 in such a manner as described above, the design of the moving mechanism 2 can be simplified.

The second processed object path 122 is provided in a penetrated relationship in the processing apparatus F1. The second processed object path 122 in the present embodiment is supported by an attachment flange 12b attached to the processing apparatus F1. Since the second processed object path 122 is provided for movement with respect to the processing apparatus F1 as described hereinbelow, the attachment flange 12b permits movement of the second processed object path 122 (more particularly, movement in a longitudinal direction of a pipe section 122a hereinafter described) while an airtight state in the processing apparatus F1 is maintained.

Then, the processed object path 12 and the hopper 11 described above are provided in a positional relationship in which the processed object S can be fed without being exposed to the outside air. In the present embodiment, the hopper 11 and part of the first processed object path 121 are formed in the inside of the supplying tank 111. Therefore, the processed object S can be fed without being exposed to the outside air.

In the present embodiment, the first processed object path 121 is a portion which extends horizontally from just below the hopper 11 toward the front. Then, the first processed object path 121 exists across a lower portion of the supplying tank main body 111a and the projection 111b which projects forwardly from the lower portion of the supplying tank main body 111a. A funnel-shaped receiving chute 16 is provided on the downstream side of the projection portion 111b and the processed object S is fed to the second processed object path 122 through the receiving chute 16.

The second processed object path 122 is connected to the downstream end of the first processed object path 121 through the joint section 15 such that the processed object S can pass therethrough. Further, the second processed object path 122 is disposed so as to be inclined obliquely forwardly downward. A pipe made of quartz glass is used for the second processed object path 122 in the present embodiment. Further, in the present embodiment, in order to make it possible to move the second processed object path 122 with respect to the processing apparatus F1 as hereinafter described, the second processed object path 122 in the present embodiment is configured as a generally linear pipe in a longitudinal direction. However, where there is no problem in movement of the processed object path 122 with respect to the processing apparatus F1 hereinafter described, at least only part of the processed object path 122 including the downstream end 12a of the processed object path 12 may be configured as a linear pipe.

As shown in FIG. 2, the receiving chute 16 is formed by shaving quartz glass. An upper half of the receiving chute 16 is a funnel-shaped portion 161 and a lower half of the receiving chute 16 is a cylindrical portion 162. In the funnel-shaped portion 161, the opening angle of an inner face is 60° (30° where it is represented by an angle with reference to a center axis of the receiving chute 16). This angle is greater than an angle of repose (approximately 40°) of silicon nuggets which are the processed object S in the present embodiment. Therefore, the processed object S is fed smoothly to the second processed object path 122 without being caught by the inner face of the funnel-shaped portion 161.

It is to be noted that, in order to protect the inner face of a valve used as the closing section 14 from the processed object S, it is desirable to position the cylindrical portion 162 in the inside of the closing section 14 upon joining of the joint section 15.

The desirable configuration is described more particularly (not shown). In the configuration, the cylindrical portion 162 of the receiving chute 16 is extended downwardly and a shaping bellows 153 of the joint section 15 is provided for extension and contraction. Consequently, upon separation of the joint section 15, the shaping bellows 153 extends and the cylindrical portion 162 is positioned upwardly with respect to an upper side joint member 151 of the joint section 15 so that the cylindrical portion 162 is protected. Then, upon joining of the joint section 15, the shaping bellows 153 is contracted and the cylindrical portion 162 is exposed from the upper side joint member 151 of the joint section 15. Consequently, it is possible to position the cylindrical portion 162 at least on the inner side of a movable portion of the closing section 14 such as a valve body so that the processed object S does not contact with the movable portion. It is to be noted that it is more desirable to set the length when the shaping bellows 153 is contracted so as to be fixed by providing a distance maintenance member such as a pin between flanges formed at the opposite end portions of the shaping bellows 153. Incidentally, the position of a lower end position of the cylindrical portion 162 upon joining of the joint section 15 is set so as to be spaced by a little distance with respect to an upper end of the pipe section 122a in order to avoid damage to the pipe section 122a of the second processed object path 122 by collision upon joining.

The processed object path 12 may be configured for movement with respect to the processing apparatus F1. This is hereinafter described.

—Processed Object Extraction Mechanism—

The processed object extraction mechanism 13 is a portion for feeding the processed object S from the processed object accommodation section 11 described above to the processed object path 12 in an airtight state. In the present embodiment, an electromagnetic vibration feeder is used as the processed object extraction mechanism 13. The electromagnetic vibration feeder is provided in the inside of the first processed object path 121. In particular, the processed object extraction mechanism 13 is provided on the feeding section 1b. Therefore, the processed object extraction mechanism 13 is not limited to a mechanism provided in the inside of the processed object path 12 as in the present embodiment, but the processed object extraction mechanism 13 may be provided at a position spaced from the processed object path 12.

The electromagnetic vibration feeder described above includes a driving section 131 and a trough 132. By vibrating the trough 132 by means of the driving section 131, the processed object S placed on the trough 132 can be fed to the downstream side. The trough 132 is a chute-shaped portion whose upper portion and downstream end are open, and quartz glass is pasted to an inner face of the trough 132 in the present embodiment. The trough 132 is provided so as to extend from just below the hopper 11 to the proximity of the downstream end of the first processed object path 121 along an extending direction of the first processed object path 121. Consequently, the processed object S gravity-dropping from the lower end of the hopper 11 is fed to the downstream side while being received on the trough 132. Then, the processed object S coming to the downstream end of the trough 132 drops to the funnel-shaped portion 161 of the receiving chute 16 described hereinabove.

In the present embodiment, since an electromagnetic vibration feeder is used as the processed object extraction mechanism 13, the processed object S can be successively loaded quantitatively into the processing apparatus F1. Therefore, the processed object S can be successively loaded little by little into the furnace body F11, and consequently, enhancement of the efficiency and the accuracy of the processing can be achieved. Naturally, also a small amount of the processed object S can be loaded. Further, conventionally there is a case in which a processed object is loaded into the furnace body at once, and in this instance, there is the possibility that breaking of the furnace body by splash of molten material or a shock upon loading or the like may occur. However, since an electromagnetic vibration feeder is used as described above, such possibility as described above can be eliminated. Further, since a small amount of the processed object S can be loaded, also where the processed object S is loaded into the furnace body F11 during operation of the processing apparatus F1, sudden temperature dropping of the molten material S1 can be suppressed, and this is advantageous in quality management.

In the present embodiment, the first processed object path 121 extends in a horizontal direction and the second processed object path 122 is inclined obliquely forwardly downward. Therefore, in the first processed object path 121, the processed object S is fed in a horizontal direction by the electromagnetic vibration feeder, but, in the second processed object path 122, the processed object S is fed obliquely downwardly by gravity drop. However, the present invention is not limited to this mode, and, for example, both of the first processed object path 121 and the second processed object path 122 may be configured so as to be directed obliquely downwardly or downwardly and feed the processed object S by gravity drop. In this instance, for example, a flow rate adjustment mechanism such as a gate or a valve provided at a lower portion of the hopper 11 functions as the processed object extraction mechanism 13.

Also where the processed object extraction mechanism 13 is used to feed the processed object S in a horizontal direction, not only such an electromagnetic vibration feeder as in the present embodiment but also various feeding mechanisms having a function capable of feeding the processed object S from the one side to the other side such as a belt conveyer or a roller conveyer can be used. Naturally, the feeding direction of the processed object S by the processed object extraction mechanism 13 may be set to a direction other than the horizontal direction.

—Closing Portion—

The closing section 14 is a section capable of blocking the processing apparatus F1 side and the processed object accommodation section 11 side of the carrying section 1b. As shown in FIG. 2, the closing section 14 in the present embodiment is provided at one position on the most upstream side of the second processed object path 122 (in particular, in the present embodiment, the closing section 14 belongs to the second processed object path 122). The closing section 14 is a gate valve provided so as to be positioned adjacent the joint section 15 hereinafter described. By blocking the closing section 14, a portion on the processing apparatus F1 side with respect to the closing section 14 can be closed up in an airtight state. Then, although it is a matter of source, the carrying section 1b can be closed so as also to prevent leakage of the processed object S. As a kind of a valve used for the closing section 14, various kinds of valves such as, for example, a globe valve, a ball valve and a butterfly valve can be used in addition to the gate valve. The closing section 14 may be provided at any position of the carrying section 1b, and, for example, the closing section 14 may be provided on the boundary between the hopper 11 and the carrying section 1b.

The position of the closing section 14 is not limited to that in the present embodiment, and may be provided on the first processed object path 121. However, where the processed object path 12 is separated by the joint section 15 hereinafter described, in order to maintain an airtight state of the processing apparatus F1 after the separation, it is necessary for the closing section 14 to be provided on the processing apparatus F1 side with respect to the joint section 15. Further, after the separation, in order to maintain the airtight state of both of the processing apparatus F1 and the loading apparatus main body 1a, it is necessary for the closing section 14 to be provided on both of the processing apparatus F1 side and the loading apparatus main body 1a side across the joint section 15.

By providing the closing section 14 in this manner, if the closing section 14 is closed, then the hopper 11 can be opened to the outside air while an inactive gas atmosphere in the inside of the processing apparatus F1 is maintained. Therefore, the lid section 111d can be opened to supplement the processed object S into the hopper 11 while melting of the processed object S in the furnace body F11 of the processing apparatus F1 is continued. Then, by opening the closing section 14 after the supplementation of the processed object S into the hopper 11, the processed object S newly supplemented in the hopper 11 can be loaded into the furnace body F11. It is to be noted that, where the processed object S newly supplemented in the hopper 11 can be loaded into the furnace body F11, it is necessary to place the hopper 11 side in an inactive gas atmosphere with respect to the closing section 14.

Conventionally, if a processed object accommodated in a hopper is used up, then it is necessary to cool the furnace body once, cancel the inactive gas atmosphere, supplement the processed object into the hopper, make an inactive gas atmosphere again and re-heat the furnace body. Therefore, time loss, more particularly, idle time (operation stopping time), is much, and this is not desirable in quality management. On the other hand, in the present embodiment, by providing the closing section 14, the processed object S can be supplemented into the processed object loading apparatus F1 without destroying the special atmosphere in the inside of the processing apparatus F1, and as a result, idle time can be reduced and the productivity can be enhanced. Therefore, the problem of the conventional technique described above can be solved.

—Joint Section—

Figure 3:
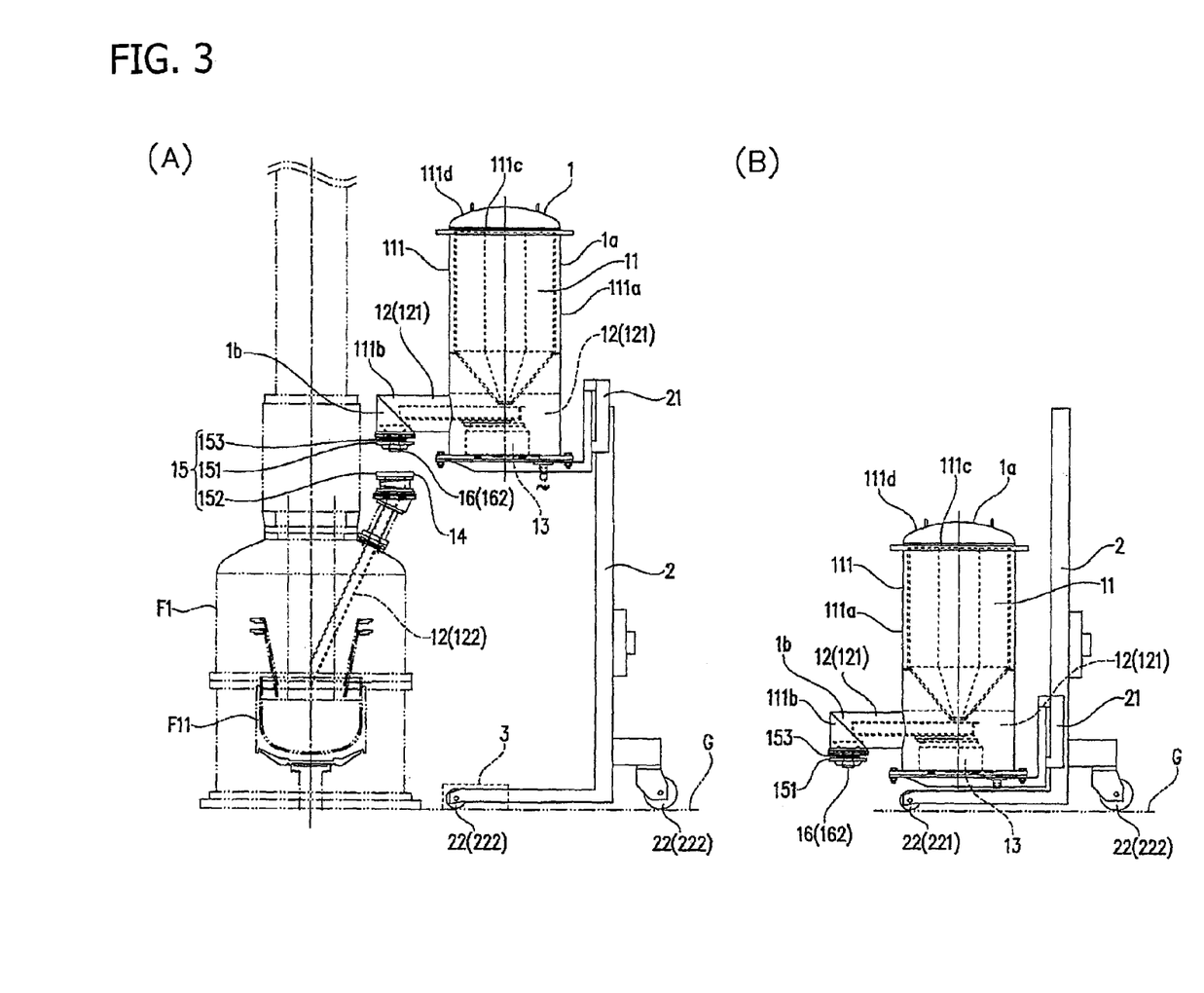

In addition to the closing section 14 described above, the joint section 15 capable of separating and joining the carrying section 1b is provided at a position in the processed object path 12 on the processed object accommodation section 11 side with respect to the closing section 14. By the joint section 15, the carrying section 1b can be separated. The joint section 15 may be provided at any position of the carrying section 1b if the position is a position on the processed object accommodation section 11 side with respect to the closing section 14. As shown in (A) of FIG. 3, by the joint section 15, a portion (loading apparatus main body 1a in the present embodiment) of the processed object loading apparatus 1 on the hopper 11 side with respect to the joint section 15 can be separated from the processing apparatus F1. Therefore, in the present embodiment, supplying of the processed object S to a plurality of such processing apparatus F1 can be carried out by the single loading apparatus main body 1a. In short, different from the conventional technique, a number of loading apparatus main bodies 1a equal to that of the processing apparatus F1 are not necessarily provided. It is to be noted that the quantities of such processing apparatus F1 and loading apparatus main bodies 1a may be set in a one by one corresponding relationship to each other similarly as in the conventional technique.

Figure 4:
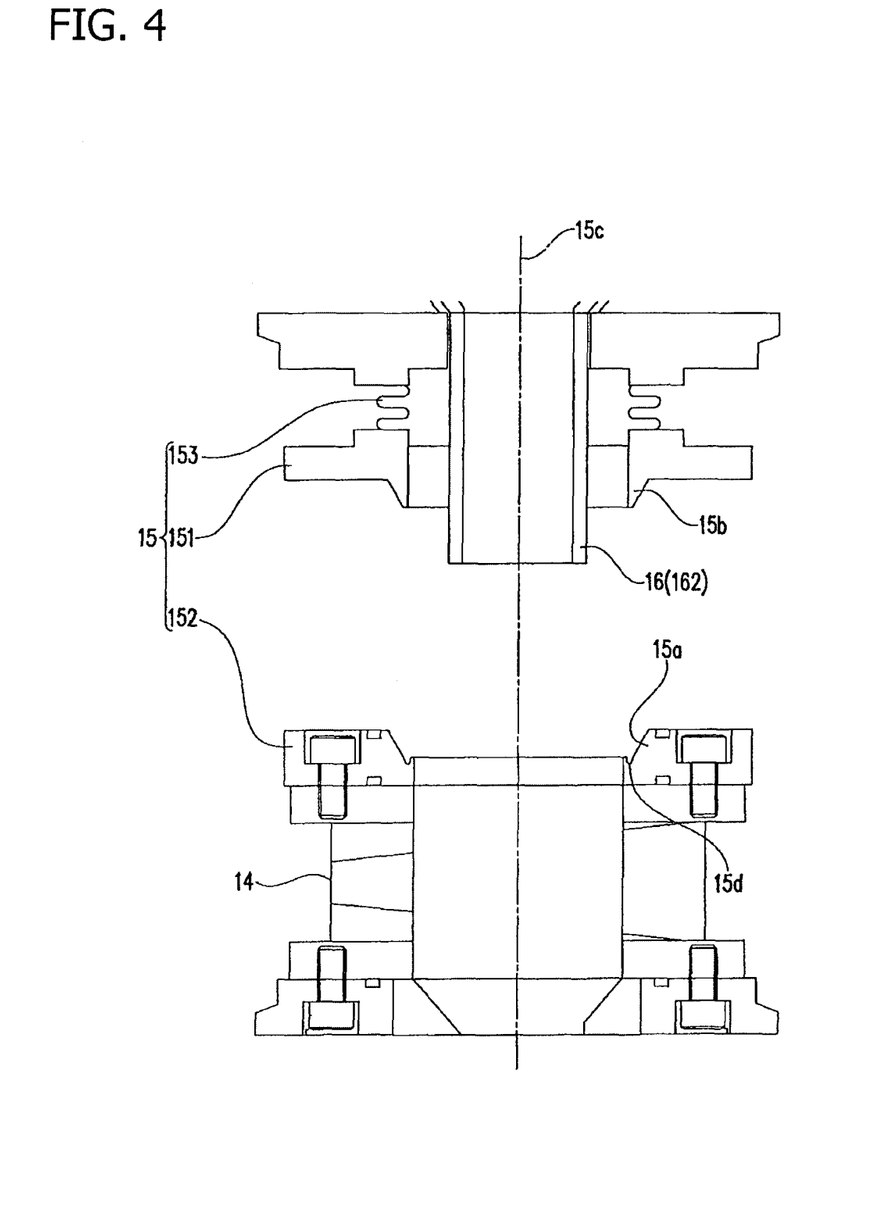
FIG. 4 is a schematic sectional view showing the joint section.

In the present embodiment, as shown in FIG. 4, the joint section 15 is provided across the first processed object path 121 and the second processed object path 122. More particularly, an upper side joint member 151 is provided at a downstream end of the first processed object path 121. The upper side joint member 151 is in the form of a plate disposed in a horizontal direction. A through-hole is provided at the center of the upper side joint member 151, and the cylindrical portion 162 of the receiving chute 16 projects downwardly through the through-hole. A shaping bellows 153 is provided above the upper side joint member 151. The shaping bellows 153 is positioned on an outer circumferential portion of the cylindrical portion 162 of the receiving chute 16 and provided in order to protect the cylindrical portion 162.

Further, a lower side joint member 152 is provided at an upstream end of the second processed object path 122 (more particularly, at the upstream end of the closing section 14). Also the lower side joint member 152 is in the form of a plate disposed in a horizontal direction. A through-hole is provided at the center of the lower side joint member 152. Therefore, upon joining of the joint section 15, the cylindrical portion 162 of the receiving chute 16 advances into the through-hole, and a lower face of the upper side joint member 151 and an upper face of the lower side joint member 152 are abutted with each other to establish the joined state illustrated in FIG. 2. In the present embodiment, the direction of relative movement between the upper side joint member 151 and the lower side joint member 152 in a case where the joint section 15 is separated and joined is the upward and downward direction.

Since the closing section 14 and the joint section 15 are provided in such a manner as described above, when the first processed object path 121 and the second processed object path 122 of the processed object path 12 are divided at the joint section 15, an airtight state of the downstream side 122 of the processed object path 12 with reference to the moving direction of the processed object S can be maintained by the closing section 14. In particular, the following can be achieved. In particular, if the processed object S remains in the inside of the hopper 11 at a point of time at which it becomes unnecessary to supplement the processed object S into the processing apparatus F1, then it is possible to separate, after the closing section 14 is closed, the processed object path 12 at the joint section 15 and apply the loading apparatus main body 1a to a processing apparatus F1 different from that before the separation. Consequently, the processed object S remaining in the hopper 11 can be loaded into the different processing apparatus F1.

If the processed object S accommodated in the hopper 11 is used up, then the closing section 14 is closed first, and then the processed object path 12 is separated at the joint section 15 as shown in (A) of FIG. 3. Then, the loading apparatus main body 1a is moved down by a manipulation of a lift 21 to move the loading apparatus main body 1a to a favorable position as shown in (B) of FIG. 3, and then processed object S is supplemented into the hopper 11. Thereafter, the loading apparatus main body 1a is attached to a processing apparatus F1 different from that before the separation. However, the loading apparatus main body 1a may be attached again to the processing apparatus F1 same as that before the separation. Particularly if the loading apparatus main body 1a is supported by the lift 21 described below, the supplementing operation described above can be carried out efficiently.

Further, although there is a demerit that it is necessary to frequently carry out supplementing of the processed object S into the hopper 11, by decreasing the capacity of the hopper 11, it is possible to make the loading apparatus main body 1a compact and further facilitate handling. Although this cannot be applied in any fabrication site, according to the present embodiment, such selection is made possible, and optimization of an apparatus suitable for a situation of the fabrication site can be anticipated.

Here, in a case in which the closing section 14 is provided only at one place in the processed object path 12, since an inactive gas atmosphere in the inside of the loading apparatus main body 1a is lost by the separation of the joint section 15, it is necessary to adjust the inside of the loading apparatus main body 1a to an inactive gas atmosphere again. Therefore, it seems a possible idea to provide a different closing section in the processed object path 12 across the joint section 15. If the countermeasure just described is adopted, then since only it is necessary to adjust the inactive gas atmosphere between the closing section 14 and the different closing section, the operation efficiency can be improved very much advantageously.

Further, in the present embodiment, also upon separation of the joint section 15, the second processed object path 122 is left in the processing apparatus F1. Therefore, removing and inserting operations of the second processed object path 122 from and into the processing apparatus F1 become unnecessary, and movement of the loading apparatus main body 1a by the moving mechanism 2 is facilitated. Also the possibility that the pipe section 122a (made of quartz glass) of the second processed object path 122 may be broken upon movement of the loading apparatus main body 1a can be reduced.

Further, where the joint section 15 is provided, the second processed object path 122 can be separated from the first processed object path 121 and moved. Therefore, movement of the downstream end 12a of the processed object path 12 between a position in a central region hereinafter described and a position displaced from the central region can be carried out by movement only of the second processed object path 122. Therefore, the space necessary for the movement can be made small and the processed object loading apparatus 1 can be miniaturized. Further, since the movement of the downstream end 12a of the processed object path 12 by the path moving mechanism 17 can be carried out separately from the movement by the moving mechanism 2 (in other words, there is no necessity for the moving mechanism 2 to take charge of movement of the downstream end 12a of the processed object path 12), the configuration of the moving mechanism 2 can be simplified. From this point, increase in size of the processed object loading apparatus 1 can be suppressed.

Here, a procedure of supplementing the processed object S using the processed object loading apparatus 1 according to the present embodiment is described briefly. If the amount of the remaining processed object S in the hopper 11 becomes small during processing of the processed object S by the processing apparatus F1, then the processed object S accommodated in the hopper 11 is fed along the processed object path 12 of the feeding section 1b by an operation of the electromagnetic vibration feeder which configures the processed object extraction mechanism 13 and is loaded into the furnace body F11. In this state, the closing section 14 is open and the joint section 15 is joined.

If the processed object S in the hopper 11 is consumed, then the operator would first close up the closing section 14 and then separate the joint section 15. Consequently, the joint section 15 can be separated while the inactive gas atmosphere in the inside of the processing apparatus F1 is maintained. Then, the operator would use the moving mechanism 2 to move the loading apparatus main body 1a to a favorable position as shown in (B) of FIG. 3, open the accommodation port 111c and supplement the processed object S into the hopper 11. Prior to the opening of the accommodation port 111c, the operator would introduce the outside air into the loading apparatus main body 1a to cancel the inert gas atmosphere.

The operator would, after the processed object S is supplemented as described above, join the joint section 15 using the moving mechanism 2. Thereafter, the operator would open the closing section 14 to establish a state in which the processed object S can be loaded into the furnace body F11. It is to be noted that, when the processed object S is to be loaded into the furnace body F11, the operator would place the internal space of the processing apparatus F1 into a vacuum state and then introduce inactive gas to establish an inactive gas atmosphere in the inside of the loading apparatus main body 1a.

—Guiding Section, Guided Section—

Now, the joint section 15 can be configured such that at least one of two parts which are separated from each other upon separation includes a guiding section 15a while the other includes a guided section 15b. The guiding section 15a and the guided section 15b are configured such that, when the joint section 15 is to be joined, the guided section 15b is guided by the guiding section 15a to establish a joined state. In particular, the guiding section 15a and the guided section 15b are elements at which positioning into the joined state of the joint section 15 is carried out. Since the guided section 15b is guided by the guiding section 15a in this manner to position the joint section 15 to a predetermined position, the joint operation can be carried out readily.

In the present embodiment, the guiding section 15a is provided on the lower side joint member 152 and the guided section 15b is provided on the upper side joint member 151 as shown in FIG. 4. However, the correspondence of the positional relationship is not limited to this, but the upward and downward relationship may be reversed or both of the guiding section 15a and the guided section 15b may be provided on each joint section 15. Or, the guiding section 15a or the guided section 15b may be provided at a portion of the processed object path 12 other than each joint section 15.

In the present embodiment, the guiding section 15a has a tapered face which is rotationally symmetrical with reference to a center axis 15c of a flow path of a circular cross section of the joint section 15 and is shaped so as to be directed toward the center axis 15c. This tapered face is provided on the processing apparatus F1 side of the joint section 15 (particularly on the lower side joint member 152). Meanwhile, the guided section 15b has a tapered face which is rotationally symmetrical with reference to the center axis 15c of the flow path of the joint section 15 and is shaped such that the center axis 15c is positioned on the back thereof. This tapered face is provided on the processed object accommodation section 11 side of the joint section 15, particularly on the upper side joint member 151. The tapered face of the guiding section 15a and the tapered face of the guided section 15b have a same slope. In other words, the tapered faces are formed as faces which have angles equal to each other with respect to the center axis 15c. When the joint section 15 is joined, the guided section 15b is guided by the guiding section 15a so as to be positioned to the joined position of the joint section 15 in a state in which the tapered face of the guiding section 15a and the tapered face of the guided section 15b abut with each other. Further, the surface of each tapered face is under a hardening process such that it is less liable to be abraded by such abutment.

—Dust Receiving Groove—

A dust receiving groove 15d is provided on an overall circumference of the guiding section 15a at a position of the tapered face most on the processing apparatus F1 side such that it surrounds the center axis 15c. Since the dust receiving groove 15d is provided in this manner, dust or the like sticking to the upper side joint member 151 or the cylindrical portion 162 of the receiving chute 16 or a very small amount of metal powder or the like which is produced when the guiding section 15a and the guided section 15b abut with each other as described above can be received by the dust receiving groove 15d. Then, the dust or the like can be removed simply by cleaning the dust receiving groove 15d. Therefore, the possibility that impurity such as dust may enter the furnace body F11 through the second processed object path 122 can be reduced, and this can contribute to improvement in quality of the single crystal silicon S2.

—Moving Mechanism—

Further, in the present embodiment, the moving mechanism 2 which can move the loading apparatus main body 1a in directions toward and away from the processing apparatus F1 is provided as shown in FIG. 1. The moving mechanism 2 in the present embodiment includes a lift 21 and a plurality of wheels 22 (front wheels 221 and rear wheels 222). The lift 21 can move the loading apparatus main body 1a in the upward and downward directions as illustrated in (A) and (B) of FIG. 3. In the present embodiment, while a manual lift of the type which moves the loading apparatus main body 1a upwardly and downwardly by a handle manipulation by an operator, alternatively a lift of the type which is driven by a motor or the like may be adopted. The wheels 22 can rotate along an installation face G on which the processing apparatus F1 is installed to move the loading apparatus main body 1a and the lift 21 principally in the forward and backward directions and can further move the loading apparatus main body 1a and the lift 21 also in the leftward and rightward directions.

By the moving mechanism 2, it is facilitated to move the loading apparatus main body 1a to separate and join the joint section 15 as illustrated in (A) of FIG. 3. Further, the loading apparatus main body 1a can be moved to a different processing apparatus F1. Further, by moving down the processing apparatus F1 to the proximity of the installation face G as illustrated in (B) of FIG. 3, supplementation of the processed object S can be simplified. Or, if the processing apparatus F1 is placed at a high position as shown in FIG. 1, then feeding of the processed object S in a portion (in the present embodiment, in the second processed object path 122) along which gravity drop occurs can be made smoother. In this manner, by the provision of the moving mechanism 2, the processed object loading apparatus 1 is very good in convenience in use. Further, also restrictions to the layout at the fabrication site can be reduced.

—Positioning Section (Stopper)—

Figure 5:
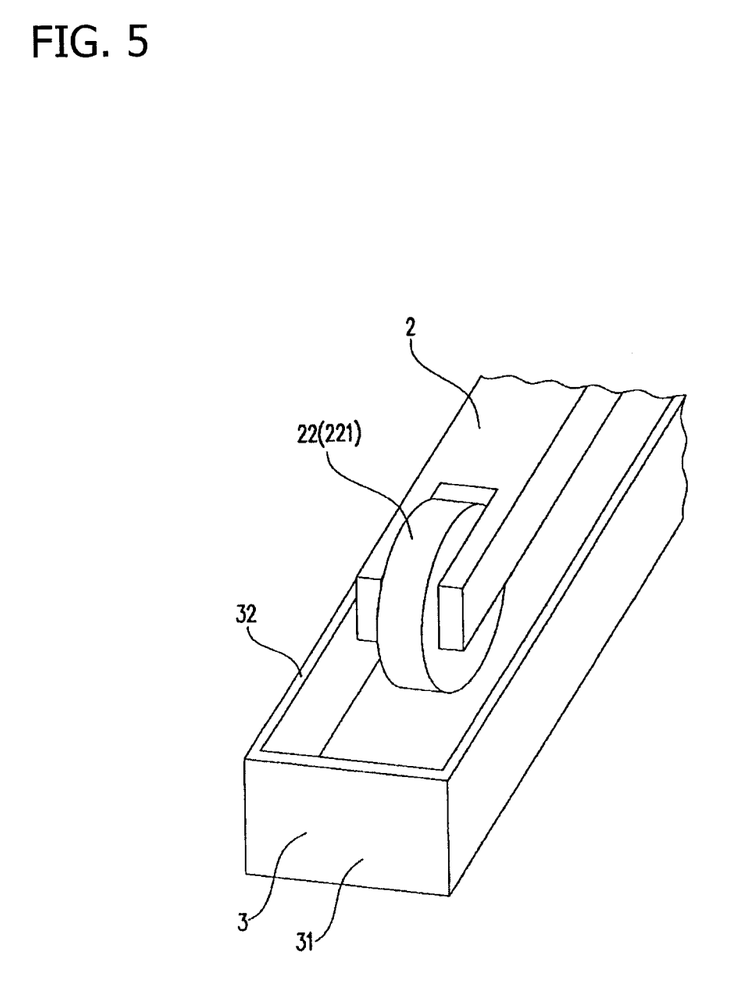
FIG. 5 is a schematic perspective view showing a stopper.

Further, in the present embodiment, the processed object loading apparatus 1 includes a positioning section 3 for restricting movement of the moving mechanism 2 in any other direction than the upward and downward directions. More particularly, a stopper 3 for stopping rotation at least of the front wheels 221 from among the plural wheels 22 in the advancing direction and defining the position of the front wheels 221 in the leftward and rightward direction with respect to the processing apparatus F1 is provided so as to be stationary with respect to the installation face G. The stopper 3 in the present embodiment is formed from a channel member as shown in FIG. 5 and has an abutting wall 31 provided uprightly at a front end thereof. The stopper 3 is fixed to the installation face G such that the abutting wall 31 is positioned forwardly. Also left and right walls 32 are provided on the stopper 3.

By using this stopper 3, at a point of time at which the front wheel 221 is positioned in such a manner that it is sandwiched by the left and right walls 32 of the stopper 3 and the front wheel 221 abuts with the abutting wall 31, the position of the front wheel 221 in the forward and backward direction with respect to the processing apparatus F1 is defined by the abutting wall 31, and also the position of the front wheel 221 in the leftward and rightward direction is defined by the left and right walls 32. If the position of the front wheel 221 is defined, then the position of the loading apparatus main body 1a in the forward and backward direction and the leftward and rightward direction with respect to the processing apparatus F1 is defined as a position at which the joint section 15 is to be separated and joined. As described hereinabove, the direction of relative movement between the upper side joint member 151 and the lower side joint member 152 when joining of the joint section 15 is to be carried out is the upward and downward direction. Therefore, after the position of the front wheel 221 is defined as described above, the operator can carry out joining of the joint section 15 only by moving the lift 21 in the upward or downward direction (usually in the downward direction). In other words, by providing the stopper 3, the joint section 15 can be joined readily.

It is to be noted that, since the guiding section 15a and the guided section 15b are provided on the joint section 15 as described hereinabove, the guiding section 15a and the guided section 15b play a role of carrying out fine adjustment of the position when joining of the joint section 15 is to be carried out.

The stopper 3 can be carried out in various forms only if it can define the position of the front wheel 221 in the forward and backward direction and the leftward and rightward direction with respect to the processing apparatus F1. For example, the stopper 3 may be configured such that it does not stop rotation through abutment of the front wheel 221 but stops rotation by friction in the leftward or rightward direction and simultaneously carries out positioning of the front wheel 221 in the leftward and rightward direction. Or, the stopper 3 may be configured such that, for example, a protrusion is provided on the moving mechanism 2 side while a depression is provided on the installation face G side such that the protrusion and the depression are fitted with each other.

Further, the stopper 3 may be provided so as to be stationary on the installation face G but may not necessarily be provided directly on the installation face G. Therefore, the stopper 3 may be fixed to a wall face or a pillar of a building at an installation site of the processing apparatus F1.

Further, while the foregoing direction is directed only to the stopper 3, rails each including the stopper 3 may be laid on the installation face G such that at least part of a range of movement of the wheels 22 is defined by traveling of the wheels 22 on the rails.

—Movement of the Processed Object Path—

In the present embodiment, the position of the downstream end 12a of the processed object path 12 with respect to the processing apparatus F1 can be moved. This movement of the downstream end 12a can be carried out between a position in the central region which is a region having an extent including the vertical line C which passes the center of the furnace body F11 and another position displaced from the central region. The "central region" signifies a region in which drawing up of single crystal silicon S2 is possible except a circumferential edge portion of the furnace body F11. In the present embodiment, more particularly the movement of the downstream end 12a is carried out in directions in which the downstream end 12a approaches and recedes from the reference provided by the vertical line C which passes the center of the furnace body F11, and the entire second processed object path 122 moves with respect to the processing apparatus F1. It is to be noted that this movement of the second processed object path 122 is carried out separately from the movement of the first processed object path 121.

The approaching and receding regarding the movement of the downstream end 12a are carried out such that, when the downstream end 12a of the processed object path 12 approaches the vertical line C (when the downstream end 12a is positioned in the central region described hereinabove), the downstream end 12a is positioned in the inner side with respect to an upward movement locus S2a of the single crystal silicon S2. Then, when the downstream end 12a recedes (when the downstream end 12a is positioned displaced from the central region described hereinabove), the approaching and receding are carried out such that the processed object path 12 is positioned on the outer side with respect to the movement locus S2a.

Therefore, when the downstream end 12a approaches the vertical line C (when the downstream end 12a is positioned in the central region described hereinabove), in a case in which the downstream end 12a of the processed object path 12 overlaps with the vertical line C, it is possible to load the processed object S from the processed object path 12 substantially to the center of the furnace body F11. Further, even in a case in which the downstream end 12a does not overlap with the vertical line C, in comparison with the conventional arrangement wherein the processed object S are loaded on the outer side with respect to the movement locus S2a, the processed object S can be loaded from the processed object path 12 at a position near to the center of the furnace body F11. Since the processed object S can be loaded from the processed object path 12 to a position nearer to the center of the furnace body F11 in this manner, the processed object S are less likely to be one-sided in the furnace body, and the silicon granule loaded in the furnace body is heated uniformly and can be melted efficiently. Therefore, also silicon drawing up operation of single crystal silicon can be carried out smoothly, and the fabrication efficiency is high. Further, since such a situation that the processed object S before melting overflow from the furnace body F11 does not occur, the processed object S can be loaded by a fixed quantity and the working efficiency is high.

Then, when the downstream end 12a recedes from the vertical line C (when the downstream end 12a is positioned in a spaced relationship from the central region described hereinabove), single crystal silicon S2 can be drawn up from the furnace body F11 without interfering with the processed object path 12.

In order to allow movement over at least part of the processed object path 12, the path moving mechanism 17 is provided. Here, at least a portion including the downstream end 12a of the processed object path 12 (in the present embodiment, the pipe section 122a) is formed as a linear pipe. This pipe is moved in a longitudinal direction by the path moving mechanism 17, and the pipe comes into and out of the processing apparatus F1 upon such movement.

It is to be noted that, in the present embodiment, the downstream end 12a of the pipe section 122a is cut open along a plane parallel to the vertical line C which passes the center of the furnace body F11. Therefore, where the downstream end 12a overlaps with the vertical line C upon approaching of the downstream end 12a to the vertical line C (when the downstream end 12a is positioned in the central region), if the pipe section 122a is moved at least by a distance equal to a radius of the movement locus S2a of the single crystal silicon S2, then interference between the single crystal silicon S2 drawn up from the furnace body F11 and the pipe section 122a can be avoided. Thus, if the downstream end 12a of the pipe section 122a is shaped in this manner, then the range of movement of the pipe section 122a can be minimized.

In the following, the path moving mechanism 17 in the present embodiment is described in more detail. As shown in (A) to (D) of FIG. 6, the path moving mechanism 17 includes a frame 171, a support shaft 172, a drive shaft 173, a handle 174, and a driving plate 175.

The frame 171 is a part fixed directly or indirectly to the processing apparatus F1 and is immovable with respect to the processing apparatus F1. The pipe section 122a of the second processed object path 122 penetrates for movement through a fixing plate 171a provided at a position on the downstream side of the frame 171.

The support shaft 172 is fixed to the frame 171. The support shaft 172 is a round bar provided in parallel to the longitudinal direction of the pipe section 122a. Further, the drive shaft 173 is provided at a position of a portion of the frame 171, which extends in parallel to the support shaft 172, on the opposite side across the pipe section 122a. Further, on the side of the frame 171 nearer to the drive shaft 173, the handle 174 is provided for rotation. The axis of rotation of the handle 174 extends perpendicularly to the drive shaft 173. The drive shaft 173 is a round bar having threads on an outer circumferential face thereof and can rotate in a circumferential direction with respect to the frame 171. A bevel gear 173a is attached to a downstream side end portion of the drive shaft 173. The bevel gear 173a is held in meshing engagement with another bevel gear 174a provided similarly at an end portion of the handle 174. Therefore, the drive shaft 173 can be rotated by rotation of the handle 174.

The driving plate 175 supports the pipe section 122a against movement. Further, the support shaft 172 and the drive shaft 173 penetrate through the driving plate 175. Such penetration through the driving plate 175 is carried out such that the driving plate 175 is attached for sliding movement to the support shaft 172 and attached for threaded engagement to the drive shaft 173. Consequently, it is possible to move the driving plate 175 toward and away from the fixing plate 171a in response to rotation of the drive shaft 173 by operation of the handle 174. Then, when the driving plate 175 makes a movement to approach the fixing plate 171a, the pipe section 122a approaches the vertical line C which passes the center of the furnace body F11 and the downstream end 12a moves to a position in the central region described hereinabove. When the driving plate 175 make a movement to recede from the fixing plate 171a, the pipe section 122a moves away from the vertical line C, and the downstream end 12a moves to a position outside the central region described above.

The position of the pipe section 122a with respect to the processing apparatus F1 can be set freely within a range within which the driving plate 175 moves. Therefore, the loading position of the processed object S into the furnace body F11 can be set freely.

It is to be noted that, between the fixing plate 171a and the driving plate 175 described hereinabove, a protective bellows 12d is provided in such a manner as to cover an outer circumference of the pipe section 122a in order to protect the pipe section 122a which is made of quartz glass. The protective bellows 12d is formed from a thin plate of stainless alloy shaped like bellows and is extended and contracted in response to the distance between the fixing plate 171a and the driving plate 175.

Figure 6:
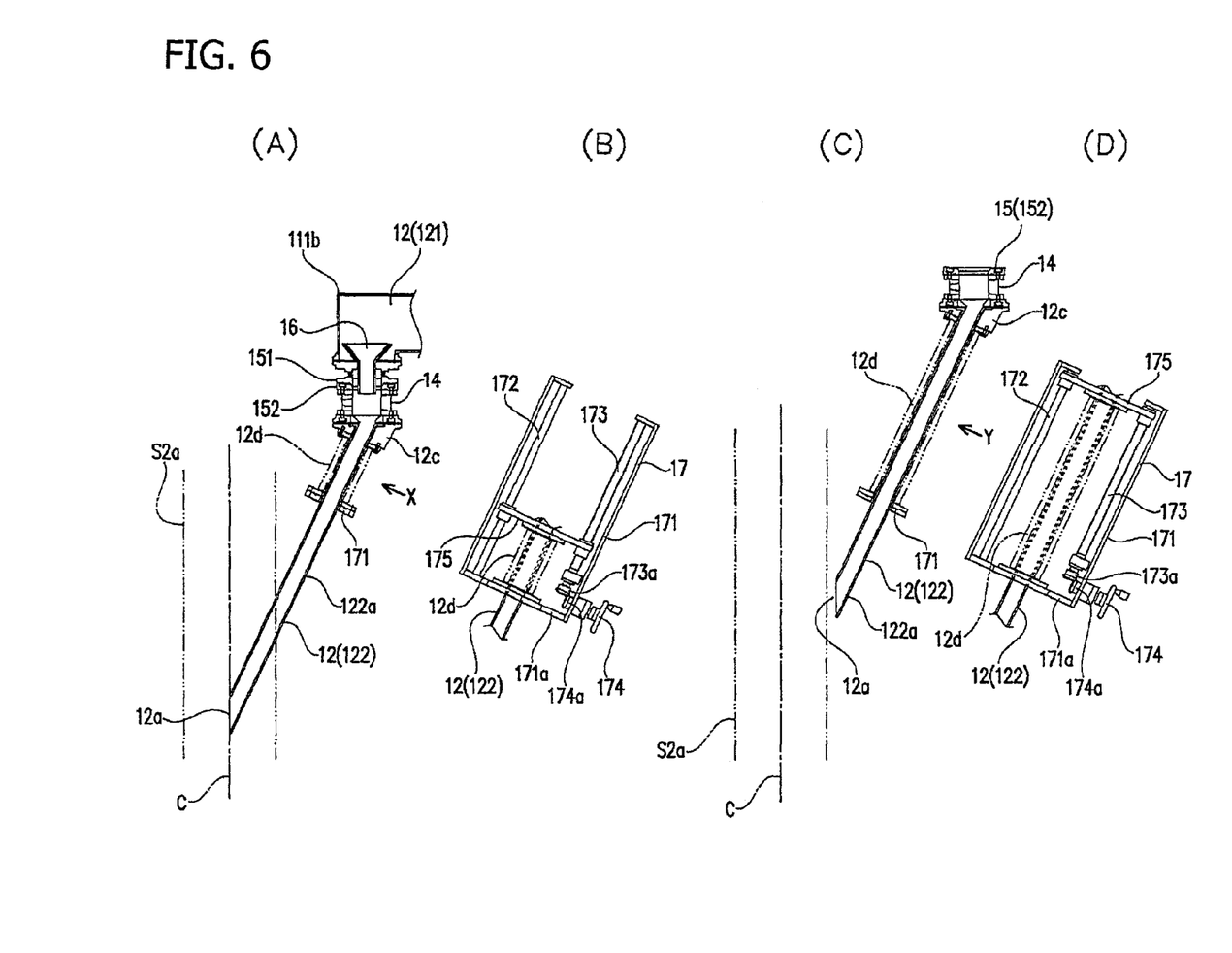

It is to be noted that, in the present embodiment, since the entire second processed object path 122 moves, the position of an upstream side end portion of the second processed object path 122 varies. Therefore, in order to move the second processed object path 122, it is necessary to separate the joint section 15 in advance and position the first processed object path 121 so as not to exist above the second processed object path 122 as shown in (C) of FIG. 6.

The configuration of the path moving mechanism 17 is not limited to that in the present embodiment but can be carried out in various modified forms. For example, the pipe section 122a may not be moved in the longitudinal direction, but a joint may be provided on the processed object path 12, for example, and the downstream end 12a of the processed object path 12 may be turned or a downstream side portion of the joint described above may be slidably moved such that the downstream end 12a moves between a position in the central region including the vertical line C and another position displaced from the central region. Or, the pipe section 122a may be extended and contracted to vary the overall length thereof such that only the downstream end 12a moves.

Meanwhile, although the path moving mechanism 17 in the present embodiment carries out a moving operation by a manual operation of the handle 174, the moving operation may be carried out by an automatic operation of a motor or the like.

It is to be noted that, in order to position the downstream end 12a of the processed object path 12 at a position displaced from the center of the furnace body F11 as described above, such a configuration that the angle of the pipe section 122a fixed to the processing apparatus F1 can be changed in addition to the movement of the pipe section 122a in the longitudinal direction as described above may be provided additionally. By the configuration, the position of the downstream end 12a of the processed object path 12 can be adjusted readily at the site, and the processed object S can be loaded to an optimum position in the furnace body F11. This configuration may be provided in the path moving mechanism 17 or may be provided independently of the path moving mechanism 17.

As such a configuration that the fixation angle of the pipe section 122a can be changed as described above, it is a possible idea, for example, to configure the lower side flange provided on the processing apparatus F1 and the upper side flange provided on the pipe section 122a such that they have an angle therebetween by adjusting the fastening degree of a nut to a bolt provided so as to extend through each of the flanges (not shown). In this instance, although the pipe section 122a extends through the flanges, while the pipe section 122a is fixed to the upper side flange, the size of the through-hole of the lower side flange is a little greater than the diameter of the pipe section 122a such that the pipe section 122a can be displaced within a range of the size of the through-hole. By the configuration, the angle of the pipe section 122a with respect to the processing apparatus F1 can be changed within a predetermined range. It is to be noted that it is necessary to provide a bellows between the flanges so that the inactive gas atmosphere of the processing apparatus F1 may be maintained. Further, if the fixation angle of the pipe section 122a is changed in this manner, then also the joint section 15 is inclined. However, this inclination can be absorbed by configuring the shaping bellows 153 of the joint section 15 such that it can be extended and contracted.

EXPLANATION OF REFERENCE

1: Processed object loading apparatus
1b: Feeding section
11: Processed object accommodation section, hopper
111c: Accommodation port
12: Processed object path
121: First processed object path
122: Second processed object path
12a: Downstream end of processed object path (second processed object path)
13: Processed object extraction mechanism, electromagnetic vibration feeder
14: Closing section, gate valve
15: Joint section
15a: Guiding section
15b: Guided section
2: Moving mechanism
3: Positioning section, stopper
C: Vertical line which passes the center of the furnace body
F1: Processing apparatus
F11: Furnace body
S: Processed object, silicon nugget

What is claimed is:

1. A loading apparatus for loading raw material into a processing apparatus that processes the raw material in an airtight state, the loading apparatus comprising:
  an accommodation section that accommodates the raw material and has an accommodation port through which the raw material is supplied into the accommodation section and which can be opened and closed;
  a feeding path through which the raw material is fed, in an airtight state, into the processing apparatus, the feeding path having a first path and a second path, the first path being outside the processing apparatus, the second path having an upstream end positioned outside the processing apparatus and a downstream end positioned inside the processing apparatus;
  a feeding mechanism that feeds, in an airtight state, the raw material from the accommodation section to the first path;
  a joint section that is movable to separate and join the first path and the second path in a vertical direction; and
  a closing section, positioned in the second path, that maintains the processing apparatus and a portion of the second path located downstream of the closing section in an airtight state, when the joint section separates the first path and the second path.

2. The loading apparatus according to claim 1, further comprising:
  a moving mechanism that moves the accommodation section, the first path, and the feeding mechanism towards and away from the processing apparatus.

3. The loading apparatus according to claim 2, wherein the moving mechanism moves the accommodation section, the first path, and the feeding mechanism in vertical and non-vertical directions, the joint section separating and joining the first path and the second path in response to the vertical movement by the moving mechanism while the non-vertical movement by the moving mechanism is restricted.

4. The loading apparatus according to claim 1, wherein the joint section has first and second portions for the first and second paths, respectively, one of the first and second portions having a guiding section and the other of the first and second portions having a guided section, and the joint section joining the first and second paths as the guiding section guides the guided section.

5. A loading apparatus for loading raw material into a processing apparatus which melts the raw material in a furnace body provided within the processing apparatus, the loading apparatus comprising:
  a feeding path through which the raw material is fed into the processing apparatus, a downstream end of the feeding path being inside the processing apparatus and movable between a central region of the processing apparatus and a peripheral region of the processing apparatus outside the central region, the central region including a vertical center line of the furnace body, and the feeding path includes a first path and a second path;
  an accommodation section that accommodates the raw material and has an accommodation port through which the raw material is supplied into the accommodation section and which can be closed in an airtight state;
  a feeding mechanism that feeds, in an airtight state, the raw material from the accommodation section to the first path;
  a joint section that separates and joins the first path and the second path; and
  a closing section, positioned in the second path, that maintains the second path in an airtight state, when the joint section separates the first path and the second path,
  wherein the second path is movable with respect to the processing apparatus, when the first path is separated from the second path by the joint section.

6. The loading apparatus according to claim 5, wherein at least a portion of the feeding path including the downstream end thereof is a linear pipe that is movable in a longitudinal direction of the feeding path so as to allow movement of the downstream end between the central region and the peripheral region, the downstream end of the feeding path being open along a plane parallel to the vertical center line of the furnace body.

7. An apparatus comprising:
  a processing apparatus that processes raw material in an airtight state;
  an accommodation section that accommodates the raw material;
  a first feeding path, provided outside the processing apparatus, that receives the raw material from the accommodation section;
  a second feeding path having upstream and downstream ends which are outside and inside the processing apparatus, respectively, the second feeding path receiving the raw material from the first feeding path;

a joint section that is movable to separate and join the first path and the second path in a vertical direction; and a closing section, positioned in the second path closer to the processing apparatus than the joint section, that maintains the processing apparatus and the second path in an airtight state, when the joint section separates the first path and the second path.

8. The apparatus according to claim 7, further comprising:

a furnace body, provided in the processing apparatus, that melts the raw material;

a moving mechanism that moves the downstream end of the second path between a central region of the processing apparatus and a peripheral region of the processing apparatus outside the central region, the central region including a vertical center line of the furnace body.

9. The apparatus according to claim 8, further comprising:

a second moving mechanism that moves the accommodation section and the first path in both vertical and horizontal directions with respect to the processing apparatus, when the first path is separated from the second path.

10. The apparatus according to claim 7, wherein at least a portion of the second path is a linear pipe that is movable in a longitudinal direction of the second path to allow movement of the downstream end of the second path between the central region and the peripheral region, the downstream end of the second path being open along a plane parallel to the vertical center line of the furnace body.

* * * * *